United States Patent [19]

Saito et al.

[11] Patent Number: 4,537,642

[45] Date of Patent: Aug. 27, 1985

[54] METHOD OF MANUFACTURING AL-STABILIZED SUPERCONDUCTOR

[75] Inventors: Shigeo Saito; Masayuki Nagata, both of Osaka, Japan

[73] Assignee: Sumitomo Electric Industries, Ltd., Osaka, Japan

[21] Appl. No.: 571,761

[22] Filed: Jan. 18, 1984

[30] Foreign Application Priority Data

Jan. 19, 1983 [JP] Japan ................................. 58-6993

[51] Int. Cl.$^3$ ............................................. H01B 12/00
[52] U.S. Cl. .................................. 148/11.5 Q; 29/599
[58] Field of Search ..................... 148/11.5 Q, 11.5 F; 29/599

[56] References Cited

U.S. PATENT DOCUMENTS 4,148,129  4/1979  Young .................................... 29/599
4,242,536  12/1980  Young .................................... 29/599

Primary Examiner—Wayland Stallard
Attorney, Agent, or Firm—Sughrue, Mion, Zinn, Macpeak and Seas

[57] ABSTRACT

A method of manufacturing an Al-stabilized superconductor is disclosed. The method comprises combining into a composite a thin elongated Al member and a superconductive wire. The Al member is preferably comprised of high purity Al having a purity of not less than 99.9% and the superconductive wire is comprised of copper or a copper alloy matrix. The method produces a composite with strong adhesion between the Al member and the superconductive wire even under adverse conditions. Further, the method can be easily and quickly carried out.

8 Claims, 12 Drawing Figures (a)    (b)    (c)

(a)    (b)    (c)
(d)    (e)    (f)

METHOD OF MANUFACTURING AL-STABILIZED SUPERCONDUCTOR

FIELD OF THE INVENTION

This invention relates to a method of manufacturing an Al-stabilized superconductor.

BACKGROUND OF THE INVENTION

In recent years in consequence of the development and feasibilization of superconductive magnets, the desirability of decreasing their weight, increasing their current density, and conferring high stability thereon has come to find growing recognition. In the light of these factors, high purity Al, as compared with high purity Cu, proves to be a highly effective stabilizing material because it has specific gravity less than one third the specific gravity of Cu, manifests high electric conductivity at extremely low temperatures, possesses high thermal conductivity, exhibits a saturated property in terms of the effect of magnetic resistance, and so on.

The Al-stabilized superconductor heretofore known to the art has high purity Al wires stranded (and further fused, optionally, as with solder) around the periphery of a superconductive wire 2 such as of Cu/Nb-Ti or Cu/Nb$_3$Sn, for example, as illustrated in FIG. 1 (cf. Japanese Patent Application (OPI) No. 163383/79 (the term "OPI" as used herein refers to a "published unexamined Japanese patent application")). The superconductor of this construction, however, is mechanically and electromagnetically inferior because the adhesion is not sufficiently strong between the Al wires 1 and the superconductive (Cu/Nb-Ti or Cu/Nb$_3$Sn) wire 2. When the entire composite is filled up with solder for the purpose of eliminating such drawbacks, the pretreatment of the Al wires generally turns out to be difficult because the surface of Al wires is covered with a stable oxide coating.

SUMMARY OF THE INVENTION

In view of the true state of affairs mentioned above, the present invention is aimed at providing an Al-stabilized superconductor having an Al ribbon or tape and a superconductive wire of Cu/Nb-Ti or Cu/Nb$_3$Sn combined into a composite by a simple method and in high yields.

The objects and characteristic features of the present invention will become apparent to those of ordinary skill in the art as the further disclosure of the invention is made in the following description with reference to the accompanying drawing.

DESCRIPTION OF PREFERRED EMBODIMENTS

Construction of the Invention

The construction of the present invention will now be described with reference to FIG. 2, FIG. 3, and FIG. 4.

Supply

By 10 and 11 are denoted Al tapes and by 12 is denoted a superconductive wire. A, B and C denote their respective supplies. These supplies feed out thin ribbons or tapes (generally two, occasionally one) of high purity Al of above 99.9% and a superconductive wire of Cu/Nb-Ti or Cu/Nb$_3$Sn.

Superconductive wires can be produced by a conventional process. Cu/Nb-Ti superconductive wires can be obtained by conventional cold or hot rolling of a Cu/Nb-Ti composite billet or by cold insertion of pipes followed by abrasion of the surface. On the other hand, Cu/Nb$_3$Sn superconductive wires can be produced by conventional bronze method, solid-liquid diffusion method, etc.

In addition to Cu, Cu alloys such as Cu-Ni, Cu-Be can be used as a matrix of superconductive wires.

The respective materials for the supplies have their size, shape, etc., determined by preparatorily measuring experimentally the amounts of transformation of the supplied materials to be transformed during the rolling. Their sizes vary with the quality of the materials and thr rolling conditions.

More particularly, the preparatory experiments can be carried out by degreasing and grinding surfaces of various samples of supplies whose sizes and shapes (e.g., grooved or non-grooved) vary, rolling the materials in an inert or reducing atmosphere with varied rolling conditions such as heating temperature and draft ratios, and checking adhesion strength between the supplies and superconductive properties. The preparatory experiments need not be performed in production line but can be carried out with ease using a heating furnace, an inert or reducing gas and a rolling machine.

The proportion of the amount of Al to that of the superconductive wire may theoretically vary freely and practically is determined depending on various factors upon designing such as the size of superconductor, aspect ratio, the amount of Al as a stabilizer and critical current.

Figure 4:
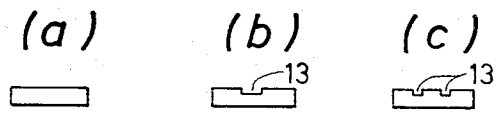
FIG. 4 is an explanatory diagram illustrating varying shapes of the Al ribbon or tape; (A) representing a flat ribbon and (B) and (C) representing flat ribbons similar to the flat ribbon of (A), except that they contain one and two grooves respectively.

The thin Al ribbon or tape may possess a simple flat rectangular cross section as illustrated in FIG. 4 (A). It is, however, desirable that the thin Al ribbon or tape should contain therein a groove 13, for example, as illustrated in FIG. 4 (B) or (C) where the ribbon or tape is expected to accommodate therein a superconductive wire.

The cross section of the superconductive wire may be in any ordinary shape such as, for example, a circle or a flat rectangle. However, generally those having a larger aspect ratio are preferred since adhesion with Al tape is stronger.

Figure 1:
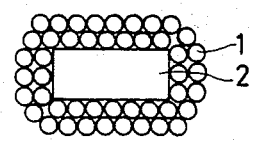
FIG. 1 is a cross section of a conventional Al-stabilized superconductor.

The surfaces of the materials for the supplies destined to come into contact with each other have preferably been degreased or given abrasion in advance. Otherwise, they are desired to be pretreated by a degreasing and abrading line interposed between Supplies A, B, C and Heating Furnace D in the layout illustrated in FIG. 1.

The combination of supplies can be selected to suit the unit weight of the superconductor to be produced. The unit weight of the superconductor is not limited by the roll proper. Thus, it is theoretically possible to produce the superconductor in any desired unit weight so far as proper supplies A, B and C, a proper reeling machine G, and proper materials for the supplies are provided for the operation.

(The apparatus for manufacture is simple in construction and enjoys flexibility because it admits of variation in the combination of component parts.)

Heating Furnace

Depending on the surface conditions of the materials for the supplies, the quality of materials, the rolling conditions, etc., the combination of the thin Al ribbon or tape and the superconductive wire of Cu/Nb-Ti or Cu/Nb$_3$Sn into a composite can be effected by cold rolling. To enhance tight adhesion between the component wires [as between Al tapes or between Al tape and Cu/Nb-Ti or Cu/Nb$_3$Sn superconductive wire (actually, the outermost Cu layer)], it is desirable that the component wires should be heated in advance and then hot rolled.

The heating temperature depends on the mechanical properties and surface conditions of the individual materials for the supplies, the heating atmosphere, and the draft ratio and, therefore, must be determined empirically. Generally, the temperature and the draft ratio are correlated to each other; the temperature of the materials may be lowered in proportion as the draft ratio is heightened.

All the materials (Al tape and superconductive wire) are not required to be heated to one and the same temperature. They may be heated to temperature varying with the various conditions mentioned above.

In the present invention, the superconductive wire to be used as a core has its outermost layer formed of Cu or Cu alloy. When the temperature of the core is high, therefore, the superconductive wire is liable to form an intermetallic compound layer between the Al tape and the Cu surface layer. This intermetallic compound layer is so brittle as to sustain cracks and possibly impair the adhesion between the Al tape and the superconductive wire. if the superconductive wire of Cu/Nb-Ti happens to be the core, it may have its properties degraded when the core temperature exceeds 500° C. because the Nb-Ti portion of the alloy yields to the effect of aging.

Because of the two points described above, this invention allows the heating of the superconductive wire as the core to be carried out at a temperature not exceeding 500° C.

As means for the heating, a cylindrical furnace may be adopted as the heating furnace D. Otherwise, the heating may be effected in the form of heating by passage of electric current or by application of high frequency waves, for example.

When it is feared that the heating treatments lead to oxidization of the surface of the materials under treatment and prevention of formation of tight adhesion, heating must be performed under an unoxidizing atmosphere generated by constant flow of an inert gas or reducing gas.

Rolling

The rolling for the purpose of this invention can be attained by the use of any ordinary rolling machine. Where the draft ratio (a factor which has significant bearing upon the quality of materials, the surface conditions, etc.) is increased for the purpose of ensuring production of an Al-stabilized superconductor of tight adhesion between the component members so that the shear stress exerted upon the materials during a cycle of rolling exceeds the shear stress at rupture of the materials, it becomes necessary to decrease the draft ratio per cycle and carry out the rolling in the pattern of multistage rolling.

Figure 2:
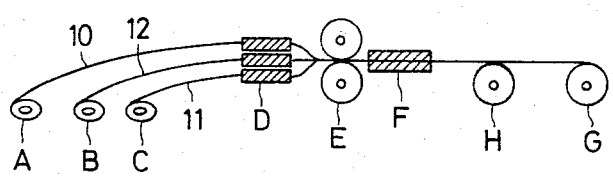
FIG. 2 is an explanatory diagram illustrating the flow or process involved in the method of the present invention for the manufacture of an Al-stabilized superconductor.

As illustrated in FIG. 2, the roll E functions better when it is a driving type roll.

Cooling

Depending on the temperature of the materials after rolling and the rolling speed, there may be formed a compound of Cu and Al in the interface between the Al tape and the superconductive wire of Cu/Nb-Ti or Cu/Nb$_3$Sn. Again depending on the extent to which this compound is formed, the interface may be embrittled. Thus, the hot rolled materials may be required to be cooled, when necessary, with a cooling device F.

Reeling

The Al-stabilized superconductor which is completed is taken up. A bundle or drum reeling machine G which suits the unit weight of the produced superconductor and meets the requirement may be used.

Optionally, a capstan H may be installed before the reeling machine relative to the direction of the flow of process, so that the superconductor which has been cooled will be passed over this capstan before it is taken up on the reeling machine.

Figure 3:
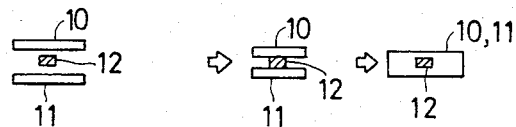
FIG. 3 is an explanatory diagram illustrating the flow of process in which Al tapes and a superconductive wire are combined by the method of this invention to produce an Al-stabilized superconductor.

FIG. 3 is an explanatory diagram illustrating a process in which the tapes 10, 11 and the superconductive wire 12 are rolled to give rise to a superconductor.

The invention will now be described with reference to the following examples. However, the scope of the invention is not limited to those examples.

EXAMPLE 1

Two tapes 3.5 mm in thickness and 20.0 mm in width of Al of high purity of 99.9% each containing along the center a groove 1.0 mm in depth and 4.0 mm in width were supplied in the upper and lower levels and a superconductive flat ribbon 2.0 mm in thickness and 3.8 mm in width of Cu/Nb-Ti was supplied in the middle level and they were jointly rolled at a draft ratio of 50%. The Al tapes and the superconductive flat ribbon were degreased and given surface abrasion before they were supplied to the rolling machine. Under a blanket of a reducing gas, the Al tapes were heated to 350° C. and the superconductive flat ribbon was heated to 250° C., both en route to the rolling machine. After the rolling, the hot composite fresh out of the rolling machine was cooled with cold water to prevent formation of a compound in the interfaces. Then, the cooled composite was taken up on the reeling machine.

In the Al-stabilized superconductor thus produced, the shear strength of the interfaces between the Al tapes and the Cu/Nb-Ti superconductive flat wire was not less than 3 kg/cm$^2$. The Cu/Nb-Ti superconductive flat wire in the composite was constricted along the center lines in the longitudinal direction. The superconductor was in a condition free from defects such as breakage. Since the heating temperature was relatively low, the superconductive property (critical current value) of the Cu/Nb-Ti superconductive flat wire was not affected discernibly by the treatment.

In the present experiment, the superconductor was produced to a total length of 100 m. About 5 m of this total length was used for conditioning the operation of the apparatus. Thus, the yield was 95%. Since the length required for the conditioning is invariable without reference to the total length of the superconductor to be produced, the yield will be heightened in proportion as the total length is increased.

EXAMPLE 2

Two tapes 3.5 mm in thickness and 20.0 mm in width of Al of high purity of 99.99% each containing along the center a groove 1.0 mm in depth and 4.0 mm in width were supplied in the upper and lower levels and a Cu/Nb-Ti superconductive flat wire 2.0 mm in thickness and 3.8 mm in width was supplied in the middle level and they were jointly rolled at a draft ratio of 50%.

The Al tapes and the superconductive flat wire were degreased and given surface abrasion before they were supplied to the rolling machine.

The materials were heated under a blanket of a reducing gas. The Al tapes and the superconductive flat wire were heated to varying temperatures between room temperature and 600° C. and then rolled. After the rolling, the produced composites were cooled with cold water.

The samples of Al-stabilized superconductor thus produced were tested for shear strength in the interface between the Al tapes and the Cu/Nb-Ti superconductive flat wire. The relation between the shear strength and the heating temperature of the core (superconductive wire) for each sample was as shown below in the table.

| Temperature of Core | Temperature of Al | | | | | | |
|---|---|---|---|---|---|---|---|
| | Room Temperature | 100° C. | 200° C. | 300° C. | 400° C. | 500° C. | 600° C. |
| Room Temperature | | | | | | o | o | o |
| 100° C. | | | | o | o | o | o |
| 200° C. | | | Δ | o | o | o | o | o |
| 300° C. | | Δ | o | o | o | o | o |
| 400° C. | | Δ | o | o | o | o | o |
| 500° C. | | Δ | Δ | Δ | Δ | Δ | Δ |
| 600° C. | | x | x | x | x | x | x |
| 700° C. | | x | x | x | x | x | x |

Legend:
The circle o stands for interface shear strength exceeding 3 kg/mm².
The triangle Δ stands for interface shear strength between 2 and 3 kg/mm²
The cross x stands for interface shear strength of less than 2 kg/mm².

The same samples were also tested for critical current. The sample whose core had been heated to 600° C. showed 10% degradation and the sample whose core had been heated to 700° C. showed 15% degradation, respectively in the critical current.

Effect

The effects brought about by the present invention are enumerated below.

(1) Since the adhesion between the component materials is metallurgical in nature and the filling ratio of the conductor is 100%, the adhesion between the superconductive wire and the Al tapes and that between the Al tapes are satisfactory. Thus, the produced superconductor enjoys excellent mechanical and electrical properties and high stability.

(2) Since the apparatus for the manufacture of the Al-stabilized superconductor is simple in construction, the conditioning of the operation is easy to accomplish.

(3) The conditioning of the operation requires only the first few meters of the entire length of the produced superconductor. The rest of the entire length of the superconductor is obtained as the product. Thus, the yields of the materials are very high.

(4) Throughout the entire process of manufacture including the step of rolling, the conditions of materials can be kept under observation. Thus, the quality control of the conduct along the production line can be effected with ease.

(5) The unit weight of the produced superconductor can be freely changed by suitably altering the supplies and the reeling machine. The freedom of the selection of the unit weight is further enhanced by the fact that the work of joining the supplies can be carried out without interrupting the operation of the production line. Thus, the apparatus for the manufacture of the Al-stabilized superconductor enjoys flexibility.

Figure 5:
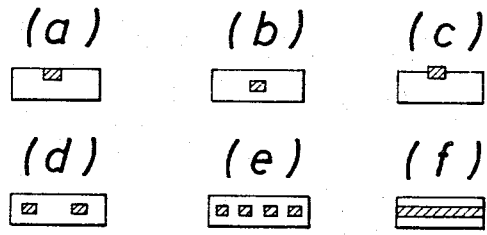
FIG. 5 is an explanatory diagram illustrating varying constructions [(A) through (F)] involving varying positional combinations of superconductive wires and Al tapes.

(6) The Al-stabilized superconductor can be readily obtained in a varying construction by suitably selecting the number of Al tapes and that of superconductive wires to be used. Examples of the construction are illustrated in FIGS. 5 (A) through (F). In the diagram, the hatched portions are superconductive wires and the unshaded portions are Al tapes.

(7) The materials can be advantageously processed at temperatures below about 500° C. to manufacture the Al-stabilized superconductor, though variable with the kinds of materials and the surface conditions. Since the materials admit of ready control of temperature, high and low, there is no possibility of the superconductive property being impaired through poor control of temperature.

While the invention has been described in detail and with reference to specific embodiments thereof, it will be apparent to one skilled in the art that various changes and modifications can be made therein without departing from the spirit and scope thereof.

What is claimed is:

1. A method of manufacturing an Al-stabilized superconductor, comprising combining into a composite an Al tape or ribbon and a superconductive wire comprised of a material selected from the group consisting of Cu and Cu alloy matrix by rolling.

2. A method as claimed in claim 1, wherein the superconductive wire is heated for rolling at a temperature of not more than 500° C.

3. A method as claimed in claim 1, wherein the aluminum tape or ribbon is comprised of aluminum of high purity of not less than 99.9%.

4. A method as claimed in claim 1, wherein the superconductive wire is a multi-core superconductive wire formed of extremely fine cores.

5. A method as claimed in claim 4, wherein the fine cores are comprised of a material selected from the group consisting of Cu/Nb-Ti and Cu/Nb$_3$Sn.

6. A method of manufacturing as claimed in claim 1, wherein the Al tape or ribbon includes a groove in which the superconductive wire is placed.

7. A method of manufacturing as claimed in claim 1, further comprising the steps of subjecting the Al tape or ribbon and the superconductive wire to degreasing and abrasion treatment prior to contacting each other.

8. An Al-stabilized superconductor produced by a method as claimed in claim 1.

* * * * *